United States Patent
Dai et al.

(10) Patent No.: US 11,254,566 B2
(45) Date of Patent: Feb. 22, 2022

(54) PREPARATION METHOD OF BIONIC ADHESIVE MATERIAL WITH TIP-EXPANDED MICROSTRUCTURAL ARRAY

(71) Applicants: Nanjing University of Aeronautics and Astronautics, Nanjing (CN); Nanjing Li-Hang Industry Institute of Bionic Technology Limited Company, Nanjing (CN)

(72) Inventors: Zhendong Dai, Nanjing (CN); Keju Ji, Nanjing (CN); Enhua Cui, Nanjing (CN); Jian Chen, Nanjing (CN); Cong Yuan, Nanjing (CN); Yiqiang Tang, Nanjing (CN)

(73) Assignees: NANJING UNIVERSITY OF AERONAUTICS AND ASTRONAUTICS, Nanjing (CN); NANJING LI-HANG INDUSTRY INSTITUTE OF BIONIC TECHNOLOGY LIMITED COMPANY, Nanjing (CN)

( * ) Notice: Subject to any disclaimer, the term of this patent is extended or adjusted under 35 U.S.C. 154(b) by 0 days.

(21) Appl. No.: 17/288,536

(22) PCT Filed: Jun. 11, 2020

(86) PCT No.: PCT/CN2020/095630
§ 371 (c)(1),
(2) Date: Apr. 25, 2021

(87) PCT Pub. No.: WO2021/004225
PCT Pub. Date: Jan. 14, 2021

(65) Prior Publication Data
US 2021/0261405 A1 Aug. 26, 2021

(30) Foreign Application Priority Data

Jul. 8, 2019 (CN) .................. 201910608241.7

(51) Int. Cl.
*B81C 1/00* (2006.01)
*B29C 33/38* (2006.01)
(Continued)

(52) U.S. Cl.
CPC ...... *B81C 1/00111* (2013.01); *B29C 33/3842* (2013.01); *B81B 1/008* (2013.01);
(Continued)

(58) Field of Classification Search
CPC .................. B81C 1/00111; B81C 2201/034
(Continued)

(56) References Cited

U.S. PATENT DOCUMENTS 5,632,878 A 5/1997 Kitano
6,287,665 B1 * 9/2001 Hammer ............ A44B 18/0061
428/100

(Continued)

FOREIGN PATENT DOCUMENTS

CN 1925766 A 3/2007
CN 102012632 A 4/2011
(Continued)

OTHER PUBLICATIONS

Rose, I., and C. Whittington. "Nickel plating handbook." Nickel Institute, Brussels, Belgium (2014) (Year: 2014).*
(Continued)

*Primary Examiner* — Benjamin A Schiffman
(74) *Attorney, Agent, or Firm* — Bayramoglu Law Offices LLC

(57) ABSTRACT

A preparation method of a bionic adhesive material with a tip-expanded microstructural array includes the following
(Continued)

steps: machining through-holes on a metal sheet; modifying morphology of a through-hole by electroplating, using the metal sheet in step 1 as an electroplating cathode, and arranging the electroplating cathode and an electroplating anode in parallel to prepare a hyperboloid-like through-hole array assembly, fitting a lower surface of the hyperboloid-like through-hole array assembly tightly to an upper surface of a substrate assembly to prepare a through-hole assembly of a mold; and filling the mold assembly with a polymer, curing, and demolding to obtain the adhesive material with the tip-expanded microstructural array.

6 Claims, 3 Drawing Sheets

(51) Int. Cl.
| | | |
|---|---|---|
| *B81B 1/00* | (2006.01) | |
| *B81C 99/00* | (2010.01) | |
| *C09J 109/00* | (2006.01) | |
| *C09J 133/08* | (2006.01) | |
| *C09J 183/04* | (2006.01) | |
| *C25D 7/00* | (2006.01) | |
| *B29K 83/00* | (2006.01) | |
| *B29K 105/00* | (2006.01) | |

(52) U.S. Cl.
CPC ......... *B81C 99/0085* (2013.01); *C09J 109/00* (2013.01); *C09J 133/08* (2013.01); *C09J 183/04* (2013.01); *C25D 7/00* (2013.01); *B29K 2083/00* (2013.01); *B29K 2105/0097* (2013.01); *B81B 2203/0361* (2013.01); *B81C 1/00261* (2013.01); *B81C 1/00301* (2013.01); *B81C 2201/034* (2013.01)

(58) Field of Classification Search
USPC ......................................................... 264/214
See application file for complete search history.

(56) References Cited

U.S. PATENT DOCUMENTS

| | | | | |
|---|---|---|---|---|
| 6,432,339 | B1* | 8/2002 | Jens | B29C 33/302 |
| | | | | 264/167 |
| 6,627,133 | B1* | 9/2003 | Tuma | A44B 18/0049 |
| | | | | 264/167 |
| 7,052,638 | B2* | 5/2006 | Clarner | B29C 48/13 |
| | | | | 264/167 |
| 7,374,706 | B2* | 5/2008 | Schulte | A44B 18/0065 |
| | | | | 264/129 |
| 7,585,169 | B2* | 9/2009 | Jahn | B29C 33/58 |
| | | | | 425/362 |
| 7,641,469 | B2* | 1/2010 | Clune | B29C 43/46 |
| | | | | 425/471 |
| 7,691,464 | B2* | 4/2010 | Gerber | B08B 17/06 |
| | | | | 428/99 |
| 8,398,909 | B1 | 3/2013 | Sitti et al. | |
| 8,524,092 | B2 | 9/2013 | Sitti et al. | |
| 9,340,708 | B2 | 5/2016 | Sitti et al. | |
| 2011/0117321 | A1 | 5/2011 | Menon et al. | |

FOREIGN PATENT DOCUMENTS

| | | |
|---|---|---|
| CN | 103738913 A | 4/2014 |
| CN | 105836696 A | 8/2016 |
| CN | 110482481 A | 11/2019 |
| KR | 100888057 B1 | 3/2009 |

OTHER PUBLICATIONS

Hong Hu, et al., Biomimetic Mushroom-Shaped Microfibers for Dry Adhesives by Electrically Induced Polymer Deformation, Applied Materials & Interfaces, 2014, p. 14167-14173, vol. 6, American Chemical Society.

Enshuang Zhang, et al., Fabrication of hierarchical gecko-inspired microarrays using a three-dimensional porous nickel oxide template, Journal of Materials Chemistry B, 2015.

Dong Yun Lee, et al., Hierarchical gecko-inspired nanohairs with a high aspect ratio induced by nanoyielding, Soft Matter, 2012, pp. 4905-4910, vol. 8, No. 18.

Aranzazu Del Campo, et al., Patterned Surfaces with Pillars with Controlled 3D Tip Geometry Mimicking Bioattachment Devices, Advanced Materials, 2007, pp. 1973-1977, vol. 19.

* cited by examiner

PREPARATION METHOD OF BIONIC ADHESIVE MATERIAL WITH TIP-EXPANDED MICROSTRUCTURAL ARRAY

CROSS REFERENCE TO THE RELATED APPLICATIONS

This application is the national phase entry of International Application No. PCT/CN2020/095630, filed on Jun. 11, 2020, which is based upon and claims priority to Chinese Patent Application No. 201910608241.7, filed on Jul. 8, 2019, the entire contents of which are incorporated herein by reference.

TECHNICAL FIELD

The present invention relates to materials science and engineering, and more particularly, to a preparation method of an adhesive material with a tip-expanded microstructural array.

BACKGROUND

Many organisms in nature exhibit excellent adhesion ability on vertical surfaces and even ceilings, such as larvae of flying moth, some beetles, flies, bees, spiders, geckos, and others. This so-called "dry adhesion" ability benefits from the microstructure at the base of their feet. Inspired by this biological function, researchers have carried out research on fiber ends of various geometric shapes (such as flat, spherical, concave or enlarged tip, etc.) (See, Del Campo A, Greiner C, álvarez I, et al., Patterned Surfaces with Pillars with Controlled 3D Tip Geometry Mimicking Bioattachment Devices. Advanced Materials, 2007, 19(15): 1973-1977), and a variety of bionic structural materials with dry adhesion properties have been prepared by combining a variety of preparation methods. In these studies, the fiber arrays with mushroom-shaped expanded tips have received extensive attention due to their stable adhesion properties under low preload (<5 N/cm$^2$) (see Hu H, Tian H, Li X. et al. Biomimetic Mushroom-Shaped Microfibers for Dry Adhesives by Electrically Induced Polymer Deformation. ACS Applied Materials & Interfaces, 2014, 6(16): 14167-14173).

The preparation methods of bionic adhesive materials with tip-expanded microstructural arrays are divided into two categories: directly re-molding with the mold and post-processing molding. In patents US2011/0117321A1 and U.S. Pat. No. 8,524,092B2, single-level and multi-level bionic adhesive materials with mushroom-shaped tip-expanded microstructural arrays were prepared by lithography of SU8 and silicon substrates to define the mold, and direct re-molding with the mold. The direct re-molding has higher requirements for the design and processing of the template, and also has requirements for the elasticity and toughness of the materials during the remolding process. Therefore, in the development of the direct re-molding, it is necessary to make a larger innovative design of the porous template to meet the needs of multi-category and large-scale preparation. The post-processing molding weakens the requirements of the early-stage porous mold, which can be achieved through soft etching, dip coating, press molding, electron beam etching and other tip modification processing.

In U.S. Pat. No. 8,398,909B1 and U.S. Pat. No. 9,340,708B2, a duck tongue-like structure is constructed at the tip of inclined polymer PU fiber array by dip coating process. This duck tongue-like structure shows the adhesion anisotropy similar to the dry adhesion unit of organisms, which provided a good design idea for the active control of adhesion and desorption of adhesive materials. The dip-coating modification process shows the convenience and diversity of controlling the tip microstructure, which is helpful to study the mapping relationship between the tip morphology and adhesion mechanics. However, the over-molding restricts the large-scale development to a certain extent.

Micro/nano-scale porous template is the key to the direct re-molding process. The preparation methods of template mainly include lithography, micro/nano imprinting, electrochemical machining and other technical methods, and the micro/nano porous substrates used are mostly silicon substrates.

The micro/nano porous substrate obtained by silicon substrate lithography has good designability in the preparation of micro/nano fibers. However, the planar characteristics of silicon substrate and the limited amount of reuse have made most of the adhesion materials prepared based on the silicon substrate lithography still far from achieving large-scale industrialization.

Porous metals/metal oxides are a kind of metals/metal oxides with a large number of directional or random holes dispersed inside. The formation of these holes can be achieved through a variety of processing methods, and the precise control of the orientation of the hole structure can also be achieved. These porous metals/metal oxides are often used as molds for molding in industrial production. Dong et al. of South Korea used anodic aluminum oxide (AAO) as a template to prepare a cross-scale structure of nano-scale polystyrene (PS) fiber array, and the AAO template was prepared by an improved electrochemical process (See, Y. L. Dong, D. H. Lee, S. G. Lee, K. Cho. Hierarchical Gecko-Inspired Nanohairs with a High Aspect Ratio Induced by Nanoyielding. Soft Matter. 2012, 8(18): 4905-4910). Zhang et al. of Harbin Institute of Technology used porous nickel/nickel oxide (p-Ni/NiO) as a template to prepare a polydimethylsiloxane (PDMS) fiber array. The p-Ni/NiO porous template was obtained by an electrodeposition process assisted by subsequent heat treatment, and demonstrated the adjustability of the pore type (See, E. Zhang, Y. Liu, J. Yu, T. Lv, L. Li. Fabrication of Hierarchical Gecko-Inspired Microarrays Using a Three-Dimensional Porous Nickel Oxide Template. Journal of Materials Chemistry B. 2015, 3(32): 6571-6575).

As a template, porous metals/metal oxides have good scalability in dimension and scale, but current research shows that the uniformity of the pore structure and the processing accuracy of the tip structure of these porous metals/metal oxides require further improvement. With the development of micro/nano processing technology, obtaining array hole metals with good orientation and uniformity and using the array hole metals as a template to prepare bionic adhesive materials has become a potential development strategy.

SUMMARY

In view of the problems existing in the prior art, the present invention discloses a preparation method of a bionic adhesive material with a tip-expanded microstructural array, the controllable modification of through holes by electroplating is skillfully utilized to realize the precision machining of complex geometries on metal materials, which greatly improves the service life of the mold and reduces the production cost. Using substrates with different elastic modulus as the mold can flexibly control the tip morphology of the microstructure, so as to realize the preparation of adhesive materials with different properties.

The present invention is realized as follows.

A preparation method of a bionic adhesive material with a tip-expanded microstructural array, including the following steps.

Step 1: machining a through-hole array on a metal sheet.

Step 2: modifying morphology of a through-hole by electroplating, using the metal sheet in step 1 as an electroplating cathode, and arranging the electroplating cathode and an electroplating anode in parallel. Since a current density of an orifice near the anode side is higher than a current density at a middle of the through-hole and an orifice far away from the anode side, a deposition rate of a coating at the orifice near the anode side is faster than that at the middle of the through-hole and the orifice away from the anode side, so that a hyperboloid-like through-hole array assembly is prepared. Subsequently, fitting a lower surface of the through-hole array assembly tightly to an upper surface of a substrate assembly, wherein the through-hole array assembly and the substrate assembly constitute a mold assembly. In the method, the morphology of the through-hole is modified by an electrochemical method to prepare a through-hole array assembly of a mold. The effect of the electrochemical method for modifying the morphology of the through-hole is that a thickness of the coating in the middle of the through-hole is thicker by electroplating, and gradually becomes thinner to both sides along the axis direction of the through-hole.

Step 3: filling the mold assembly in step 2 with a polymer, curing and demolding to obtain the adhesive material with the tip-expanded microstructural array.

Further, the substrate assembly is a series of components containing materials with different elastic moduli, and the elastic moduli of the substrate assembly range from 0.3 to 60 MPa. The substrate assembly is a plurality of elastic pads, and an elastic modulus of a material of each elastic pad is different. When in use, an elastic pad with an appropriate elastic modulus is selected according to different requirements. When the substrate assemblies with different elastic moduli are selected for use, the tip morphology of the microstructure can be adjusted.

Further, in the through-hole array in step 1, an aperture of the through-hole is not greater than 100 μm, a center distance between two adjacent through-holes is not greater than 100 μm, the through-holes are cylindrically shaped holes or special-shaped holes, and a thickness of the metal sheet is not greater than 1 mm.

Further, the polymer in step 3 is an organic elastomer or an inorganic elastomer, including polydimethylsiloxane, a silicon polymer elastomer with additional cross-linking agents, a prepolymer containing acrylate functional groups, a two-component prepolymer, a rubber material, and a modified material of the above-mentioned elastomer.

Further, the electroplating process in step 2 include the following steps: electroplating a cleaned and activated through-hole array with a nickel pre-plating formula for 1-3 min at room temperature with a current density of 2-8 A/dm$^2$; then placing the through-hole array into an electroplating bath, wherein the through-hole array is used as a cathode, a nickel plate is used as an anode, and the two electrodes are arranged in parallel; electroplating parameters include a current density of 2-5 A/dm$^2$, and a plating temperature of 50° C.-70° C.; subsequently, performing mechanically stirring throughout the whole electroplating process, and performing electroplating for 1-3 h to form the hyperboloid-like through-hole array assembly with a central diameter smaller than diameters of two ends.

Compared with the prior art, the present invention has the advantages as follows.

(1) In the preparation method of the present invention, through the processing of through-hole array and electroplating method, namely through the combination of subtractive manufacturing method and additive manufacturing method, the precise machining of complex geometries on metal materials is realized, which greatly improves the service life of the mold and reduces the production cost. In the present invention, the controllable modification of through holes by electroplating is used to realize the precision machining of complex geometries on the metal materials, which greatly improves the service life of the mold and reduces the production cost compared with the existing non-metallic mold. For the substrate assemblies with different elastic moduli, the tip morphology of the microstructure can be adjusted by adjusting the positive pressure between the through-hole array assembly and the substrate assembly. The greater the pressure between the through-hole array assembly and the substrate assembly, the smaller the elastic modulus of the substrate, the deeper the substrate sinks into the through-holes, and the deeper the central depression of the "sucking plate-like" tip in the microstructure of the finally poured adhesive material, thereby realizing the preparation of adhesive materials with different properties.

(2) In the preparation method of the present invention, the used substrate assembly of the mold includes a series of components containing materials with different elastic moduli. When the substrate assemblies with different elastic moduli are selected for use, the tip morphology of the microstructure can be flexibly adjusted by combining with the applied positive pressure.

(3) The preparation method of the present invention can be used for one-step molding, and the economic and reliable industrial production of the adhesive materials with the tip-expanded microstructural arrays can be realized in combination with the micro/nano imprinting technology.

DETAILED DESCRIPTION OF THE EMBODIMENTS

Figure 1:
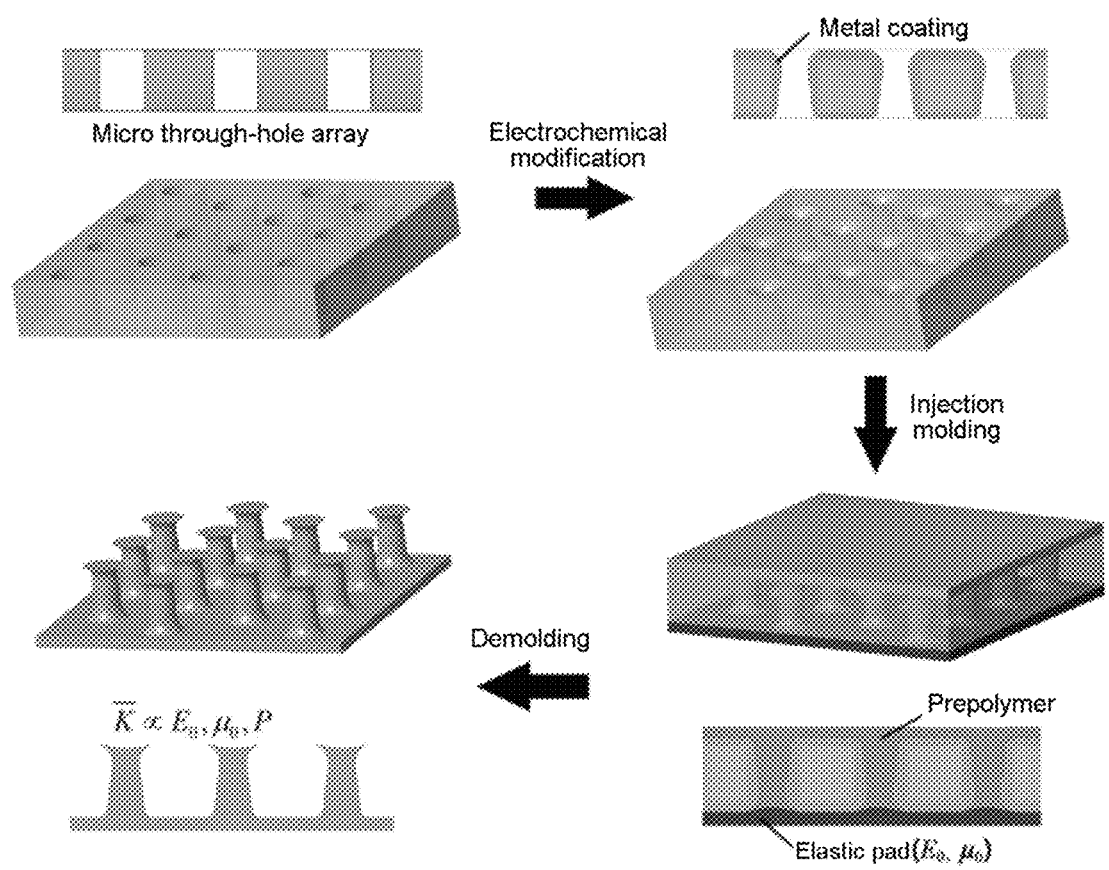
FIG. 1 is a flow chart showing a preparation method of an adhesive material with a tip-expanded microstructural array of the present invention.

In order to make the objectives, technical solutions and advantages of the present invention clearer, the present invention is described hereinafter with the specific embodiments shown in the drawings. However, it should be understood that these descriptions are only illustrative and are not intended to limit the scope of the present invention. In addition, in the following description, the description of well-known structures and techniques is omitted to avoid unnecessary confusion of the concepts of the present invention.

As shown in FIG. 1, the flow chart of the preparation method of the adhesive material with the tip-expanded microstructural array of the present invention is shown, and the specific steps are as follows.

Step 1: a through-hole array is machined on a metal sheet by laser. The diameters of the through-holes are not greater than 100 μm, and the center distance between two adjacent through-holes is not greater than 100 μm. The thickness of the metal sheet is not greater than 1 mm, and the through-holes are cylindrical-shaped holes or special-shaped holes.

Step 2: the morphology of the through-hole is modified by electroplating to prepare a mold assembly; the modification of the through-hole by electroplating means that the thickness of the coating in the middle of the through-hole is thicker by electroplating, and gradually becomes thinner to both sides along the axis direction of the through-hole.

Step 3: the mold assembly is filled with a polymer, cured and demolded to obtain the adhesive material with the tip-expanded microstructural array. The mold assembly includes the through-hole assembly and a substrate assembly, the through-hole assembly is prepared by step 2 in claim 1, and the substrate assembly includes a series of components containing materials with different elastic moduli. When the substrate assemblies with different elastic moduli are selected for use, the tip morphology of the microstructure can be adjusted. The polymer is an organic elastomer or an inorganic elastomer, such as polydimethylsiloxane (PDMS), a silicon polymer elastomer with additional cross-linking agents, a prepolymer containing acrylate functional groups, a two-component prepolymer, a rubber material, or a modified material of the above materials.

In this embodiment, SUS304 stainless steel strip is used for preparation, and the following technical solution are used for specific implementation.

Step 1: SUS304 stainless steel strip with a thickness of 0.06 mm is used, and a picosecond laser is used to process a cylindrical through-hole array with a diameter of 0.085 mm and a hole spacing of 0.13 mm. The adjacent two rows of holes are arranged in a staggered arrangement.

Figure 2:
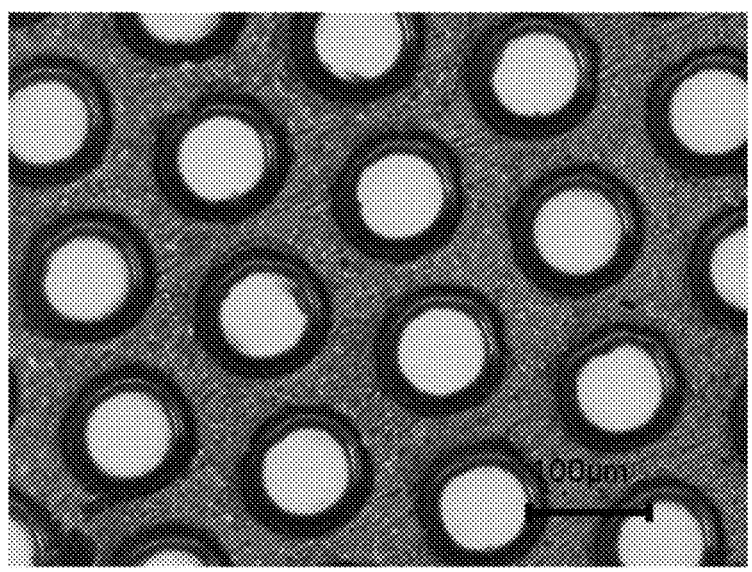
FIG. 2 is a top view showing a through-hole assembly of the present invention.
Figure 3:
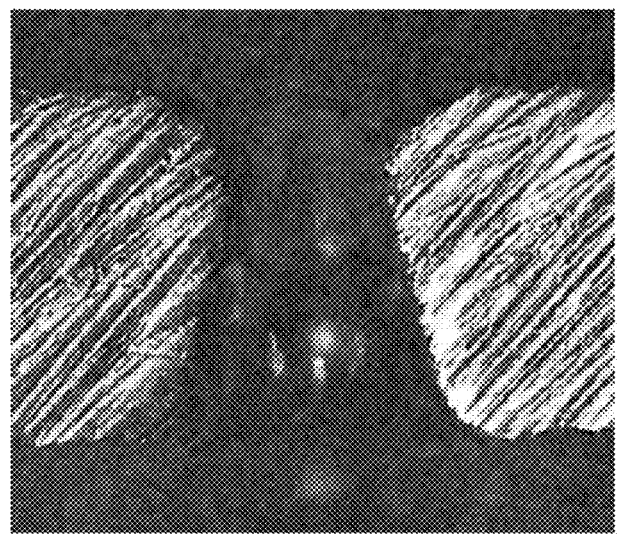
FIG. 3 is a cross-sectional view showing the through-hole assembly of the present invention.

Step 2: the through-hole array prepared in step 1 is immersed in a 10 wt % oxalic acid solution, subjected to ultrasonic cleaning until the slag is removed, put into an alkaline degreaser for ultrasonic cleaning for 20 min, then cleaned with deionized water, immersed in 37% concentrated hydrochloric acid (HCl) for 0.5-1 min at room temperature to activate the surface, electroplated with a nickel pre-plating formula for 1 min at room temperature with a current density is 2 A/dm$^2$. Subsequently, the through-hole array is placed into an electroplating bath, the through-hole array is used as a cathode, the nickel plate is used as an anode, and the two electrodes are arranged in parallel. The electroplating parameters include a current density of 2 A/dm$^2$ and a plating temperature of 55° C.-60° C. Subsequently, mechanically stirring is performed throughout the whole electroplating process, and the electroplating is performed for 2 h to form the hyperboloid-like through-hole array assembly with a small diameter in the middle and large diameters at both ends, as shown in FIGS. 2-3.

Figure 4:
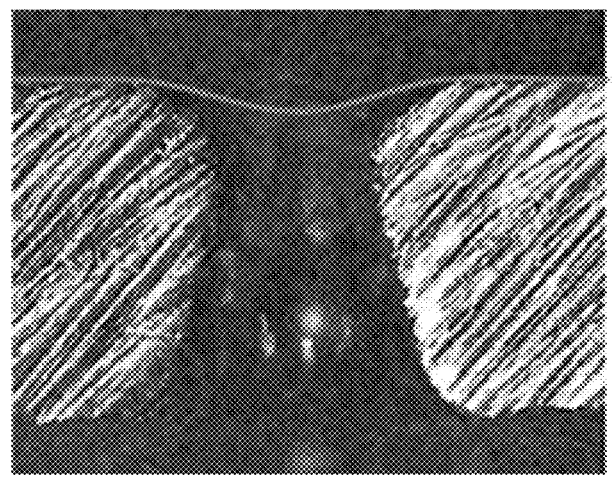
FIG. 4 is a schematic diagram showing a control principle of a substrate assembly on the tip morphology of a microstructure of the present invention.
Figure 5A:
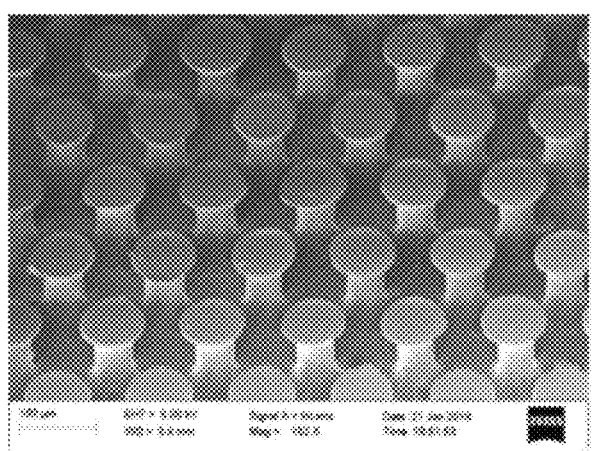
FIG. 5A is an electron microscope diagram showing an adhesive material with a tip-expanded cylindrical array in the embodiment of the present invention.
Figure 5B:
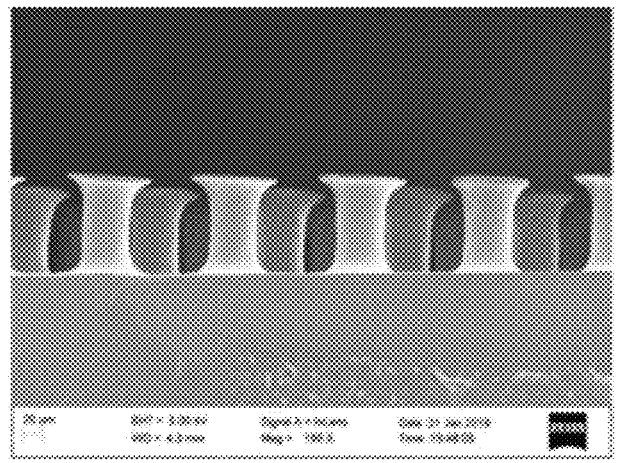
FIG. 5B is an electron microscope diagram showing the adhesive material with the tip-expanded cylindrical array in the embodiment of the present invention.
Figure 5C:
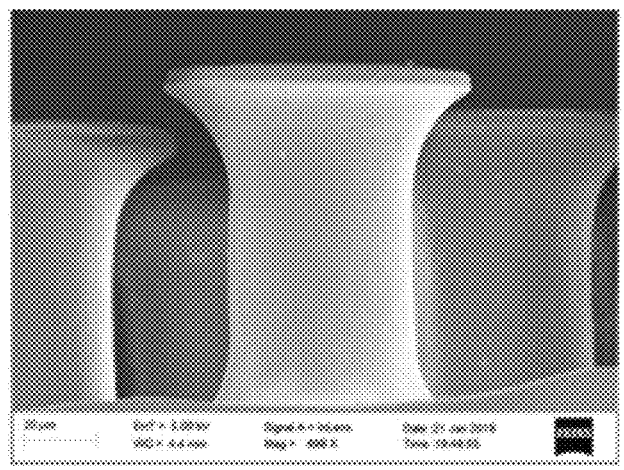
FIG. 5C is an electron microscope diagram showing the adhesive material with the tip-expanded cylindrical array in the embodiment of the present invention.

Step 3: (Sylgard 184A) and a curing agent (Sylgard 184B) are mixed evenly according to a mass ratio of 10:1 to prepare PDMS in advance. The lower surface of the through-hole assembly and the upper surface of the substrate assembly of the mold are closely fitted under a certain positive pressure, and the hyperboloid-like through-hole and the elastic pad form a "sucking plate-like" interface, as shown in FIG. 4. Then, the PDMS is poured into the mold. In this embodiment, polytetrafluoroethylene (PTFE) with large elastic modulus is selected as the substrate assembly of the mold. The bubbles are removed by vacuum for 10 min. Then the product is cured in a convection oven at 70° C. for 2 h. Finally, demolding is carefully performed to obtain the adhesive material with the tip-expanded cylindrical array, as shown in FIGS. 5A-C. The greater the pressure between the through-hole assembly and the substrate assembly, the smaller the elastic modulus of the substrate, the deeper the substrate sinks into the through-holes, and the deeper the central depression of the "sucking plate-like" tip in the microstructure of the finally poured adhesive material, thereby realizing the preparation of adhesive materials with different properties. The depth of the central depression of the "sucking plate-like" tip is positively correlated with the elastic modulus ($E_o$), Poisson's ratio ($\mu_o$), and positive pressure (P) of the substrate.

The basic principles, main features and advantages of the present invention are shown and described above. Those skilled in the art should understand that the present invention is not limited by the above-mentioned embodiments. The above-mentioned embodiments and the descriptions in the specification only illustrate the principle of the present invention. Various changes and modifications may be derived without departing from the spirit and scope of the present invention, which fall within the scope of the present invention. The protective scope of the present invention is defined by the protective claims and the equivalents thereof.

What is claimed is:

1. A preparation method of a bionic adhesive material with a tip-expanded microstructural array, comprising the following steps:
   step 1: machining a through-hole array on a metal sheet;
   step 2: modifying morphology of a through-hole by an electroplating process, using the metal sheet in step 1 as an electroplating cathode, and arranging the electroplating cathode and an electroplating anode in parallel to prepare a hyperboloid-like through-hole array assembly, fitting a lower surface of the hyperboloid-like through-hole array assembly tightly to an upper surface of a substrate assembly under a positive pressure, wherein the upper surface of the substrate assembly extends over an opening of the hyperboloid-like through-hole array assembly, and the hyperboloid-like through-hole array assembly and the substrate assembly constitute a mold assembly; and
   step 3: filling the mold assembly in step 2 with a polymer to obtain a product, curing and demolding the product to obtain the bionic adhesive material with the tip-expanded microstructural array; wherein
   the substrate assembly is a plurality of elastic pads with different elastic moduli, and the elastic moduli of the substrate assembly range from 0.3 to 60 MPa; a tip morphology of the tip-expanded microstructural array is adjustable by adjusting the positive pressure between the hyperboloid-like through-hole array assembly and the substrate assembly.

2. The preparation method of the bionic adhesive material with the tip-expanded microstructural array of claim 1, wherein in the through-hole array in step 1, an aperture of the through-hole is not greater than 100 μm, a center distance between two adjacent through-holes is not greater than 100 μm, the through-hole is a cylindrical-shaped hole or a special-shaped hole, and a thickness of the metal sheet is not greater than 1 mm.

3. The preparation method of the bionic adhesive material with the tip-expanded microstructural array of claim 1, wherein the electroplating process in step 2 comprise the following steps:
   performing a first electroplating on a cleaned and activated through-hole array with a nickel pre-plating formula for 1-3 min at room temperature, with a first current density of 2-8 A/dm$^2$ to obtain a pre-plated through-hole array;
   then placing the pre-plated through-hole array into an electroplating bath, wherein the pre-plated through-hole array is used as a cathode, a nickel plate is used as an anode, and the cathode and the anode are arranged in parallel; electroplating parameters include a second current density of 2-5 A/dm$^2$, and a plating temperature of 50° C.–70° C.;
   subsequently, performing a mechanically stirring throughout the electroplating process, and performing a second electroplating on the pre-plated through-hole array for 1-3 h to form the hyperboloid-like through-hole array assembly with a central diameter smaller than diameters of two ends.

4. The preparation method of the bionic adhesive material with the tip-expanded microstructural array of claim 1, wherein the polymer in step 3 is an organic elastomer or an inorganic elastomer selected from the group consisting of polydimethylsiloxane, a silicon polymer elastomer with additional cross-linking agents, a prepolymer containing acrylate functional groups, a two-component prepolymer, a rubber material, a modified material of the polydimethylsiloxane, a modified material of the silicon polymer elastomer with additional cross-linking agents, a modified material of the prepolymer containing acrylate functional groups, a modified material of the two-component prepolymer, and a modified material of the rubber material.

5. The preparation method of the bionic adhesive material with the tip-expanded microstructural array of claim 1, wherein the polymer in step 3 is an inorganic elastomer selected from the group consisting of polydimethylsiloxane, a silicon polymer elastomer with additional cross-linking agents, a rubber material, a modified material of the polydimethylsiloxane, a modified material of the silicon polymer elastomer with additional cross-linking agents, and a modified material of the rubber material.

6. The preparation method of the bionic adhesive material with the tip-expanded microstructural array of claim 1, wherein the polymer in step 3 is an organic elastomer selected from the group consisting of a prepolymer containing acrylate functional groups, a two-component prepolymer, a rubber material, a modified material of the prepolymer containing acrylate functional groups, a modified material of the two-component prepolymer, and a modified material of the rubber material.

\* \* \* \* \*